United States Patent

Bernstein

[15] 3,638,073

[45] Jan. 25, 1972

[54] SEMICONDUCTOR ASSEMBLY WITH HEAT SINK AND CONNECTOR BODIES

[72] Inventor: Bernard Bernstein, Brooklyn, N.Y.

[73] Assignee: General Instrument Corporation, Newark, N.J.

[22] Filed: Feb. 19, 1970

[21] Appl. No.: 12,728

[52] U.S. Cl..........................317/100, 174/DIG. 5, 317/118, 339/112 R

[51] Int. Cl...........................................................H01l 1/16

[58] Field of Search................174/DIG. 5; 317/99, 100, 118, 317/234 A, 101 CC; 339/28 R, 102 R, 112 R, 277 R

[56] References Cited

UNITED STATES PATENTS

| | | | |
|---|---|---|---|
| 3,151,279 | 9/1964 | Scherb | 317/118 |
| 3,013,186 | 12/1961 | Jones | 317/100 |
| 3,316,453 | 4/1967 | Lassers | 317/99 |
| 3,307,077 | 2/1967 | Bernstein | 317/99 |
| 3,264,534 | 8/1966 | Murphy | 339/112 X |

FOREIGN PATENTS OR APPLICATIONS

| | | | |
|---|---|---|---|
| 418,449 | 2/1967 | Switzerland | 317/100 |

OTHER PUBLICATIONS

IBM Tech. Discl. Bulletin, Vol. 11, No. 10, Mar. 1969, Bryden on Heat Sink, pg. 1,323

The Master, 22nd Ed., 1958, pg. F- 316, United Catalogue Publ., Inc.

*Primary Examiner*—Lewis H. Myers

*Assistant Examiner*—Gerald P. Tolin

*Attorney*—James and Franklin

[57] ABSTRACT

A semiconductor assembly comprises a plurality of semiconductor components each having a first and second terminal means operatively connected respectively to first and second parts of the components and extending outwardly therefrom, and a plurality of spaced-apart electrically conductive bodies each having a groove adapted to receive the terminals means of the semiconductor components. The bodies are heat sink blocks and the terminal means on the semiconductor components are flexible wires which are received in the grooves in the blocks, the components thereby being supported between blocks. Excellent heat dissipation results due to the large heat conducting mass provided by the plurality of blocks. The assembly is adapted for use in a number of circuit applications such as a bridge rectifier circuit in which the electrically conductive heat sink blocks receive a plurality of diode terminals at the circuit junctions.

16 Claims, 16 Drawing Figures

INVENTOR
BERNARD BERNSTEIN
BY
James F. Franklin
ATTORNEY

INVENTOR
BERNARD BERNSTEIN
BY [signature]
ATTORNEY

INVENTOR
BERNARD BERNSTEIN
BY James & Franklin
ATTORNEY

SEMICONDUCTOR ASSEMBLY WITH HEAT SINK AND CONNECTOR BODIES

This invention relates to semiconductor component assemblies, and more specifically to a bridge rectifier circuit assembly including separate heat sink bodies thermally and electrically connected to the semiconductor components at the circuit junction points.

One disadvantageous feature of a semiconductor component is its inability to dissipate the heat which is generated by a passage of current therethrough. The dissipation of this heat is important to the proper and continuous operation of the device over extended periods. Accordingly, a wide variety of thermally conductive elements are employed in semiconductor assemblies to dissipate as much heat as possible from the semiconductors during their operation. Typically the semiconductor engages a large mass of thermally conductive material which in turn is mounted on another thermally conductive body such as a supporting chassis. The combination of these conductive bodies is usually sufficient to dissipate the internal heat generated in the components. While certain successful assemblies have been constructed to dissipate heat from specific types of semiconductor components, there still remains an outstanding need for simplified, inexpensive assemblies which perform the same function with greater efficiency. However, other important considerations such as size, cost and weight of the assembly as well as good electrical contact between components limit to a large extent the continuing efforts to improve heat dissipation. Particular difficulty is experienced when semiconductor components such as diodes having flexible leads are used in an assembly. Such diodes find widespread use in many circuit applications, particularly in bridge rectifiers. This type of semiconductor is difficult to assemble with heat dissipating components because it is small in size and not readily adapted for mounting. In addition, the flexible wire leads must be interconnected in some way at various junction points in the circuit, thereby increasing assembly time. As a result, the assembly operation is costly and time consuming and is not readily adapted to large scale production techniques.

Accordingly, it is the primary object of this invention to provide a semiconductor assembly which is characterized by its excellent heat dissipating capability as well as by its small size, low cost and good electrical contact between components.

It is yet another object of this invention to provide a rectifier bridge assembly comprising diodes having flexible leads which is characterized by its compactness, excellent diode heat dissipation performance and ease of assembly.

The subject invention which accomplishes the above objects comprises a semiconductor assembly having a plurality of semiconductor components each comprising a semiconductor member and first and second terminals means operatively connected to first and second parts of the semiconductor member and extending outwardly therefrom. A plurality of spaced electrically conductive bodies are each provided with a receptacle which is adapted to receive the terminal means on the semiconductor members. One of the bodies receives the first terminal means of a semiconductor component in the receptacle therein, and another of the bodies receives the second terminal means of that semiconductor component in its receptacle. As a result, each semiconductor component is carried between two bodies in the assembly. The bodies are composed of a material having excellent thermal and electrical conductivity such as copper and are positioned in engagement with the opposite ends of the semiconductor member, thereby dissipating heat from the member at several locations.

In the preferred embodiment, the semiconductor components each comprise a diode having flexible wire leads extending from the anode and cathode sections thereof. The bodies are separated heat sink blocks each having at least one groove to receive the wire leads. The wire leads are placed in appropriate grooves and are permanently fixed in the grooves by the application of solder or other bonding material. A plurality of these diodes and bodies are assembled into a circuit configuration such as a bridge rectifier. Some of the copper bodies are provided and several grooves and receive wire leads of several diodes at the junction points of the circuit. Thus, in a full wave bridge rectifier circuit, four heat sink blocks are positioned to receive the four diodes, one of the blocks being positioned at each circuit junction of the bridge. With this arrangement, excellent thermal and electrical conduction is achieved.

Electrically conductive connecting means such as "quick disconnect" terminal tabs are directly connected to the bodies and extend upwardly therefrom. These tabs provide a means for connecting various parts of the circuit to external circuitry such as a voltage source. Preferably, an additional groove is provided in the heat sink blocks to receive the terminal tabs. With this structure, the tabs and the diode leads may be soldered to the conductive body simultaneously such as by means of a hotplate, thereby greatly facilitating the manufacturing process. As an alternative to the terminal tab, a turret-type terminal may be pressed into a hole in the heat sink body and a connection to external circuitry may be made therewith.

When the assembly of semiconductor components, heat sink bodies and projecting terminal tabs has been completed it is placed in a housing and encapsulated by an epoxy material. In one embodiment of the invention, the housing is rectangular in shape and the heat sink bodies are positioned against the sidewalls of the housing preferably at the corners. In a single-phase full wave rectifier four such bodies are positioned within the case. The bodies are of a size sufficient to cover a substantial part of the bottom wall of the housing, so that when the housing is itself mounted on another component such as a chassis of an electronic system the heat generated within the several diodes is distributed uniformly to the chassis. The heat dissipation from these components is thereby greatly improved to the extent that the current rating of the bridge is several times greater than that of the individual diodes.

As thus far described, the assembly of the invention is readily adapted for large scale production. Further modification of the copper heat sink blocks may be made so that the assembly is capable of rapid construction with diodes of different sizes. Such adaptability is effected by means comprising a projecting member extending outwardly from two adjacent sidewalls of the rectangular heat sink blocks. When the blocks are positioned in opposite relation within the rectangular housing, the spacing between blocks may be varied by positioning the blocks in either of two positions. In one position the projecting members on the sidewalls of the block engage the sidewalls of the housing thereby spacing the blocks from these sidewalls. Opposing blocks are drawn closer together and toward the center of the housing thereby enabling smaller diodes to be carried between blocks. In the second position, the blocks are rotated so that the sidewalls of the blocks which do not have the projecting members are positioned in engagement with the sidewalls of the housing. In this position, the opposing blocks are further spaced from each other, and diodes carried therebetween may be of a larger size because of the increase in space between blocks.

The semiconductor assembly of the invention is equally applicable for use in the construction of a three phase rectifier bridge circuit as well as a single-phase rectifier bridge circuit. In the three-phase rectifier system the copper heat sink blocks may take the form of bus bars having a plurality of grooves on the upper surface thereof, those grooves receiving the flexible leads on the diodes in the same manner as above described. The bus bars may be positioned adjacent opposite sidewalls in a rectangular housing. A plurality of smaller irregularly shaped conductive bodies are positioned between the bus bars in the housing and receive the terminal leads connected to the other end of the diodes. Electrical connection to the various junction points in the three-phase rectifier may be made with terminals in the same manner as above described with reference to the single-phase rectifier.

To the accomplishment of the above, and to such other objects as may hereinafter further appear, the present invention relates to a semiconductor component assembly as defined in the appended claims, and as described in the following drawings in which:

Figure 1:
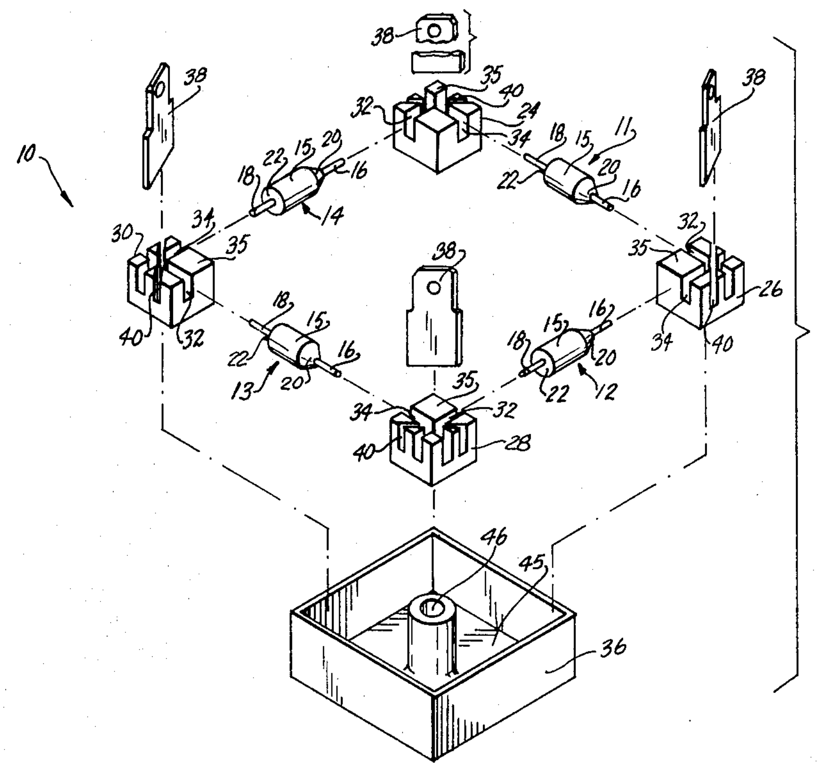
FIG. 1 is an exploded isometric view of the parts of a semiconductor component assembly typical of the invention prior to the assembly thereof.
Figure 2:
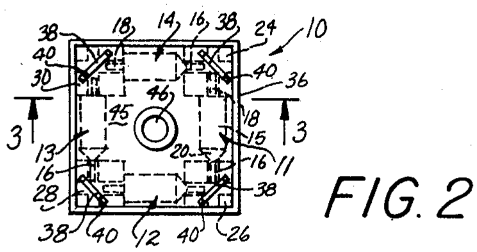
FIG. 2 is a top plan view of the assembly formed after the parts of FIG. 1 are assembled.
Figure 4:
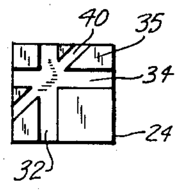
FIG. 4 is a top plan view of a heat sink block employed in the assembly of FIG. 1.

Referring to FIG. 1, the parts of a semiconductor assembly 10 typical of the invention are illustrated prior to assembly. These parts comprise four semiconductors generally designated 11, 12, 13 and 14, each comprising a semiconductor member 15 and first and second terminal means 16 and 18 respectively. The terminal means 16 and 18 are here shown as flexible wires which are operatively connected to first and second parts 20 and 22 respectively on the members 15 and which extend outwardly from opposite ends of the members 15. A plurality of electrically conductive bodies 24, 26, 28 and 30 here shown as rectangular blocks are positioned to receive the leads 16 and 18 on semiconductors 11, 12 13 and 14. For this purpose each of the bodies is provided with receptacles here shown as grooves 32 and 34. The grooves 32 and 34 are formed in the upper surface 35 of each block as shown best in FIG. 4 for block 24. With this structure each of the bodies 24 to 30 is adapted to receive the wires 16 or 18 of two semiconductors as shown in FIG. 2. Therefore, each of the semiconductors is carried between two bodies in the final assembly as best shown in FIGS. 2 and 3.

Since each of the bodies 24–30 is electrically conductive, a circuit junction is formed directly at the body when several terminal wires of the semiconductors are received in the grooves of a single body. Furthermore, the bodies are positioned to engage the parts 20 and 22 of the semiconductor member 15 and since each of the bodies comprises a large thermally conductive mass, heat dissipation from the semiconductor members 15 is greatly facilitated. Thus the bodies 24–30 are effective to provide a good electrical connection between semiconductors as well as to draw heat from the semiconductors during their operation.

Figure 3:
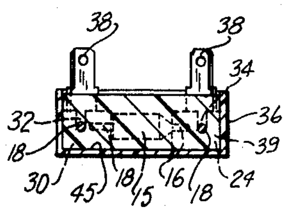
FIG. 3 is a cross-sectional view of the assembly of FIG. 2 taken on line 2—2 of FIG. 2.

Referring to FIGS. 2 and 3, the semiconductors and bodies are positioned within a housing 36. A plurality of quick disconnect tab terminals 38 extend from the housing 36 for connection with external circuitry. These terminals 38 are placed in diagonal grooves 40 which angularly intersect the perpendicular grooves 32 and 34 in each of the bodies 24 to 30. A bonding agent such as solder (not shown) fills the grooves and surrounds the wire leads 16 and 18, as well as the tab terminals 38. Simultaneous bonding of these terminals on each of the bodies may be effected with the use of a hotplate or the like, thereby greatly reducing the assembly time. An epoxy material 39 is shown within the housing 36 encapsulating the components to provide a moisture-resistant environment.

Figure 5:
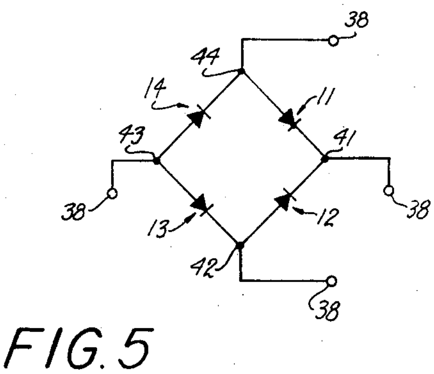
FIG. 5 is a schematic diagram of the circuit formed by the assembly of FIG. 1.

The semiconductors 11–14 illustrated in FIGS. 1, 2 and 3 are diodes and when the components are assembled as shown in FIG. 2, the full wave bridge rectifier illustrated schematically in FIG. 5 is formed. The bodies 24 to 30 are positioned at the four circuit-junction points 41, 42, 43 and 44 of the diodes and the terminals 38. Excellent heat dissipation and electrical interconnection is achieved at each of these junctions due to the direct connection of the components including the terminal tabs 38 to the bodies.

The housing which is suitably composed of a plastic material or a metallic material sprayed with a thin coat of an electrically insulating epoxy material is preferably rectangular in shape so that it may readily accept the rectangularly shaped conductive bodies 24–30 such as at the corners as shown in FIG. 2. With this assembly, a small, lightweight and compact assembly may be easily produced. In addition, the conductive bodies are of a size sufficient to cover the substantial part of the bottom wall 45 of the housing 36, so that an even distribution of the heat drawn from the semiconductors may be made through this bottom wall to another conductive member (not shown but conventional such as the chassis of an electronic system) to which the housing 36 is connected. The connection to such a member may be conveniently made by means of a bolt or the like threaded into the centrally located hole 46 which passes through the bottom wall 45. As a result of this arrangement, conduction of heat away from the semiconductors is improved to the extent that the current rating of the full wave bridge is greater than that of the individual diodes.

Figure 6:
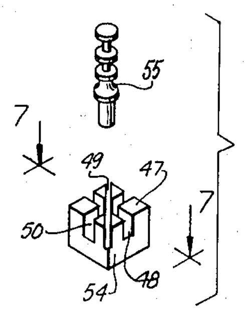
FIG. 6 is an isometric view of a heat sink block of the type as that illustrated in FIG. 4 and an electrical terminal therefor prior to assembly.
Figure 7:
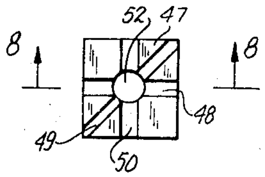
FIG. 7 is a top plan view taken on line 7—7 of FIG. 6.
Figure 8:
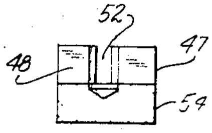
FIG. 8 is a cross-sectional view taken on line 8—8 of FIG. 7.

FIGS. 6 to 8 illustrate a heat sink block 47 modified to receive a different type of connecting terminal which is to connect the junction points of the semiconductor circuit with external circuitry. As shown in these illustrations the body 47 is provided with perpendicular grooves 48 and 50 which are adapted to receive semiconductor terminal leads such as shown in FIGS. 1–3. A hole 52 formed at the central portion of the body 47 and into the base part 54 is used to receive the turret-type terminal 55 which is illustrated in FIG. 6 just prior to insertion into the hole. The terminal 55 may be held in place within the hole 52 by a suitable bonding agent such as solder. A diagonal groove 49 is cut into the block 46 so that the block may be interchangeably used with the several types of connecting terminals described.

Figure 9:
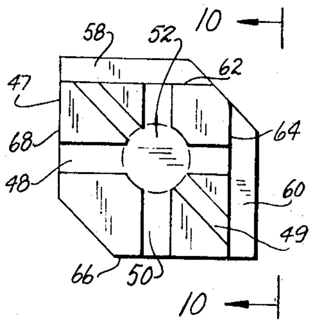
FIG. 9 is a top plan view of another embodiment of a heat sink block employed in the assembly of the invention.
Figure 10:
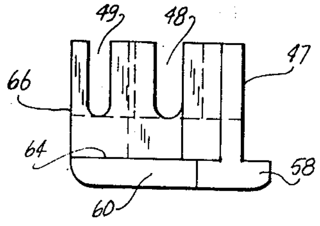
FIG. 10 is a side elevational view taken on line 10—10 of FIG. 9.

The heat sink body 47 is modified even further as shown in FIGS. 9 and 10 to enable semiconductors of various sizes to be received between bodies in an assembly, Laterally extending members 58 and 60 project from the sidewalls 62 and 64 of the body 47. Opposite sidewalls 66 and 68 on the body 47 are not provided with such members. Thus, when several such bodies are positioned in opposing relation within a housing in an assembly, the spacing between bodies may be varied by placing the members 58 and 60 or the sidewalls 66 and 68 in engagement with the walls of the housing.

Figure 11:
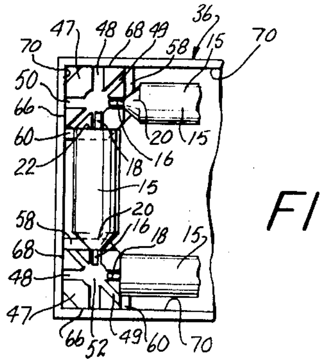
FIGS. 11 and 12 are fragmentary top plan views of a semiconductor assembly employing the block shown in FIGS. 9 and 10 illustrating the several operative positions of the block to receive diodes of different sizes.
Figure 12:
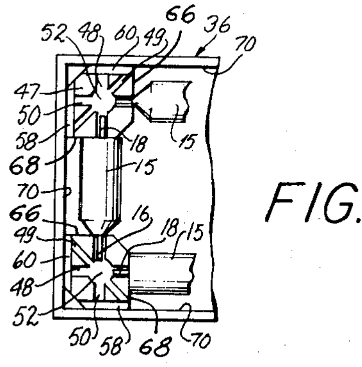

FIGS. 11 and 12 illustrate such positioning in an assembly. In FIG. 11 for example, the sidewalls 66 and 68 of two opposing bodies 47 engage the inner sidewalls 70 of the rectangular housing 36 at opposite corners thereof. Diode members 15 of a suitable size to fit in the space between bodies 47 so as to engage the bodies at the parts 20 and 22 are therefore carried in this space. In FIG. 12 however, the bodies 47 have been rotated so that the members 58 and 60 engage the inner sidewalls 70 at the corners of the housing 36. The members 58 and 60 are effective to space the bodies 47 from the housing walls 70 and therefore to reduce the spacing between oppositely positioned bodies. As a result, smaller diodes may be placed between bodies as shown in FIG. 12. It will be appreciated that diodes of different sizes may readily be accommodated by varying the extent of projection of the members 58 and 60.

FIGS. 13 to 16 illustrate another embodiment of a semiconductor assembly typical of the invention. The embodiment there shown is a three-phase bridge rectifier employing six diodes generally designated 72 which are similar to those illustrated in FIG. 1 and are accordingly identically marked. As shown best in FIG. 14, bus bars 76 and 78 are positioned against opposite inner sidewalls 70 within the rectangular housing 36. Each of these bus bars 76 and 78 includes a plurality of parallel grooves 80 which are adapted to receive the terminal means 16 and 18 on the diodes 72. At one end of these bus bars a larger groove 82 is used to receive the terminal tabs 38 in a manner similar to that described with reference to FIGS. 1 to 5. Positioned at the central portion of the housing 36 and spaced from bus bars 76 and 78, three heat conductive bodies 84, 86 and 88 receive the terminal leads 16 and 18 on the semiconductors 72. For this purpose, each of these bodies 84, 86 and 88 are provided with two parallel and spaced grooves 90 and 92. A central groove 94 is also placed in the upper surface of each of these bodies to receive terminal tabs 38 as shown.

Figure 13:
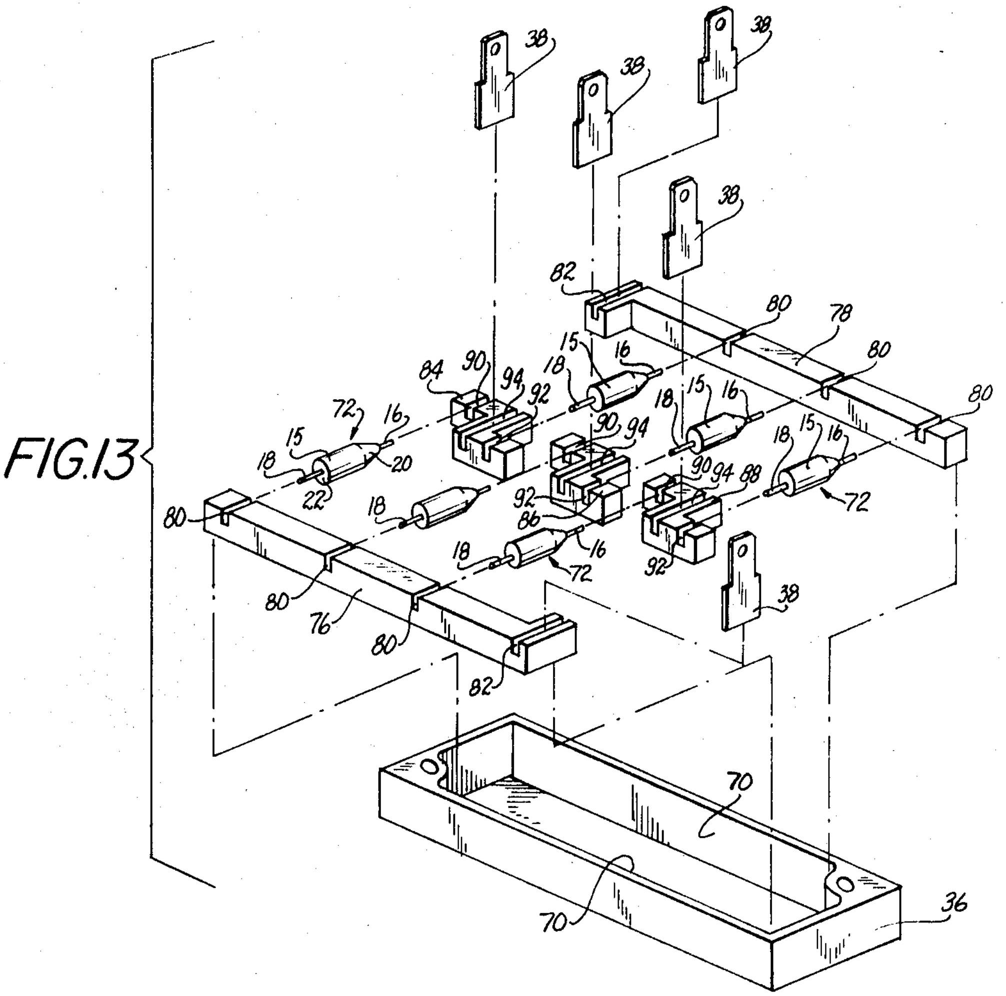
FIG. 13 is an exploded isometric view of the parts of another embodiment of a semiconductor assembly typical of the invention prior to the assembly thereof.
Figure 14:
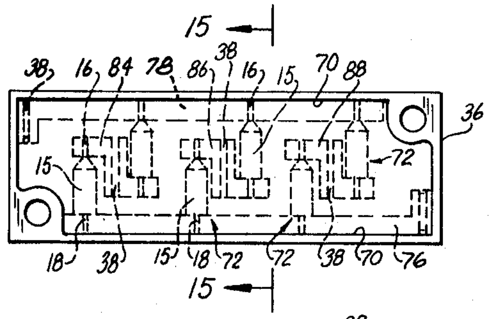
FIG. 14 is a top plan view of the assembly formed after the parts of FIG. 13 are assembled.
Figure 15:
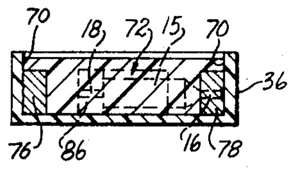
FIG. 15 is a cross-sectional view taken on line 15—15 of FIG. 14.
Figure 16:
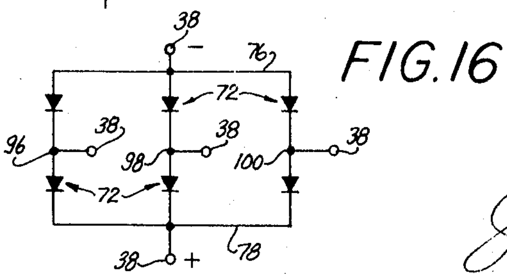
FIG. 16 is a schematic diagram of the three-phase rectifier circuit formed by the assembly shown in FIG. 14.

The assembly of parts illustrated in FIG. 13 may be carried out in the same manner as described with reference to the embodiment of FIGS. 1 to 5, and the final assembly is shown in its completed form in FIG. 14. The schematic equivalent of the three-phase bridge circuit formed with this assembly is shown in FIG. 16. Each of the heat sink bodies 84, 86 and 88 is positioned at an electrical junction 96, 98, 100 and there interconnects the several diodes received in the grooves 90 and 92. The bus bars 76 and 78 respectively function to electrically connect the anodes and cathodes of the diodes as well as to receive and support the diodes connected thereto. As shown in FIG. 15, each of the diodes 72 is suspended between two heat sink blocks in a manner similar to that illustrated in FIG. 3. Thus, excellent heat dissipation and good electrical connection is also readily accomplished in a three-phase bridge rectifier circuit.

From the foregoing it will be appreciated that the semiconductor assembly of the invention is simple, economical to manufacture and highly efficient in the dissipation of heat from the semiconductor components which form a part of the assembly. In addition, excellent electrical connection at circuit junctions is assured by the use of electrically conductive heat sinks at the junctions. Modification of the heat sink components to receive semiconductors of different sizes facilitates the large scale production of the semiconductor assemblies.

Although several embodiments of the invention have been illustrated and described, it will be apparent that additional modifications of the invention may be made without departing from the scope of the invention as defined in the following claims.

I claim:

1. A semiconductor assembly forming an operative circuit comprising a plurality of semiconductor components each having first and second elongated terminal means first ends of which are operatively connected to said semiconductor component and the other ends thereof extending outwardly therefrom in different directions, a plurality of spaced-apart relatively massive thermally and electrically conductive bodies each having a plurality of receptacles adapted to receive the other ends of said terminal means along a substantial length thereof, one of said bodies receiving said first terminal means of a given semiconductor component in said receptacle therein, and another of said bodies receiving said second terminal means of said given semiconductor components in said receptacle therein, said first and second terminal means of each of said components being received in said receptacles said semiconductor components thereby being supported at their ends between bodies in said assembly, said bodies serving as the operative conductive circuit junctions between said semiconductor components, and tray means for mounting said assembly, said tray means having a bottom wall and a plurality of sidewalls, said bodies being supported on said bottom wall and being spaced around the periphery of said tray means in engagement with one or more sidewalls thereof.

2. The semiconductor assembly of claim 1, in which said bodies each comprise a top surface, a bottom surface and one or more side surfaces, and wherein said receptacle in each of said bodies comprises a groove in said top surface extending axially outwardly to at least one side surface in at least one direction defining a slot in said side surface.

3. In the semiconductor assembly of claim 2, in which said bodies are positioned on said bottom wall of said tray means adjacent opposite sidewalls thereof in opposing relation, spacer means projecting outwardly from at least one side surface of at least one of said bodies engaging at least one of said sidewalls and effective to space said body from said sidewall of said housing thereby to position said opposing bodies closer to each other, said opposing bodies thereby being adapted to receive semiconductor components of a smaller size, when said at least one body is positioned with its spacer means engaging said sidewall.

4. The semiconductor assembly of claim 2, in which at least one of the bodies has first and second grooves, said grooves being angularly positioned in said body relative to each other and receiving terminal means of said semiconductor components.

5. In the semiconductor assembly of claim 2, in which at least one of the bodies has an opening at a surface thereof, an electrically conductive connecting means received in said opening and projecting outwardly from said body and effective to electrically connect said body to electrical means external of said assembly.

6. The semiconductor assembly of claim 5, in which said opening comprises a groove extending across a surface of said body and in which said connecting means comprises a substantially flat terminal adapted for quick connection with and disconnection from external circuit means.

7. The semiconductor assembly of claim 4, wherein said tray means comprises a rectangular tray having a bottom and a plurality of sidewalls extending up therefrom, and wherein said bodies comprise rectangular blocks positioned in said tray at the corners thereof engaging adjacent walls thereof.

8. The semiconductor assembly of claim 7, wherein the sidewalls of said tray extend upwardly above said rectangular blocks when said blocks are positioned therein.

9. The semiconductor assembly of claim 5, wherein said tray means comprises a rectangular tray having a bottom and a plurality of sidewalls extending up therefrom, and wherein said bodies comprise rectangular blocks positioned in said tray at the corners thereof engaging adjacent walls thereof.

10. The semiconductor assembly of claim 9, wherein the sidewalls of said tray extend upwardly above said rectangular blocks when said blocks are positioned therein.

11. In the semiconductor assembly of claim 1, in which at least one of the bodies has an opening at a surface thereof an electrically conductive connecting means received in said opening and projecting outwardly from said body and effective to electrically connect said body to electrical means external of said assembly.

12. The semiconductor assembly of claim 11, in which said opening comprises a groove extending across a surface of said body in which said connecting means comprises a substantially flat terminal adapted for quick connection with and disconnection from external circuit means.

13. In the semiconductor assembly of claim 1, a plurality of semiconductor members comprising diodes having terminal means comprising flexible wires, said diodes being interconnected to form a rectifier bridge circuit having a plurality of circuit junctions, said bodies receiving said terminal means of said diodes at said circuit junctions.

14. The semiconductor assembly of claim 1, wherein said tray means comprises a rectangular tray having a bottom and a plurality of sidewalls extending up therefrom, and wherein said bodies comprise rectangular blocks positioned in said tray at the corners thereof engaging adjacent walls thereof.

15. The semiconductor assembly of claim 14, wherein the sidewalls of said tray extend upwardly above said rectangular blocks when said blocks are positioned therein.

16. The semiconductor assembly of claim 1, further comprising insulating material overlying said semiconductor components and said bodies forming said operative circuit thereby to encapsulate said assembly to provide a moisture-resistant environment therefor.

* * * * *